United States Patent
Berman et al.

(10) Patent No.: US 6,764,749 B2
(45) Date of Patent: Jul. 20, 2004

(54) METHOD TO IMPROVE THE RESOLUTION OF A PHOTOLITHOGRAPHY SYSTEM BY USE OF A COUPLING LAYER BETWEEN THE PHOTO RESIST AND THE ARC

(75) Inventors: Michael J. Berman, West Linn, OR (US); George E. Bailey, Welches, OR (US)

(73) Assignee: LSI Logic Corporation, Milpitas, CA (US)

( * ) Notice: Subject to any disclaimer, the term of this patent is extended or adjusted under 35 U.S.C. 154(b) by 23 days.

(21) Appl. No.: 10/207,607

(22) Filed: Jul. 29, 2002

(65) Prior Publication Data

US 2004/0018448 A1 Jan. 29, 2004

(51) Int. Cl.⁷ ............................. B32B 7/00; G03C 1/815; G03C 1/825

(52) U.S. Cl. .................... 428/212; 428/411.1; 428/913; 430/510; 430/512

(58) Field of Search ................................ 430/510, 512; 428/212, 411.1, 446, 195, 913

(56) References Cited

U.S. PATENT DOCUMENTS 6,051,369 A * 4/2000 Azuma et al. .............. 430/312
6,103,456 A * 8/2000 Tobben et al. .............. 430/317

\* cited by examiner

*Primary Examiner*—Ramsey Zacharia
(74) *Attorney, Agent, or Firm*—Trexler, Bushnell, Giangiorgi & Blackstone, Ltd.

(57) ABSTRACT

A method to improve the resolution of a photolithography system by using one or more coupling layers between a photo resist and an anti-reflective coating. The coupling layer(s) compensate for a mis-match in indexes of reflection between the photo resist and anti-reflective coating and minimize the amount of energy which is reflected back into the photo resist, thereby improving the quality of the resulting image which is formed on the photo resist during the process.

16 Claims, 2 Drawing Sheets

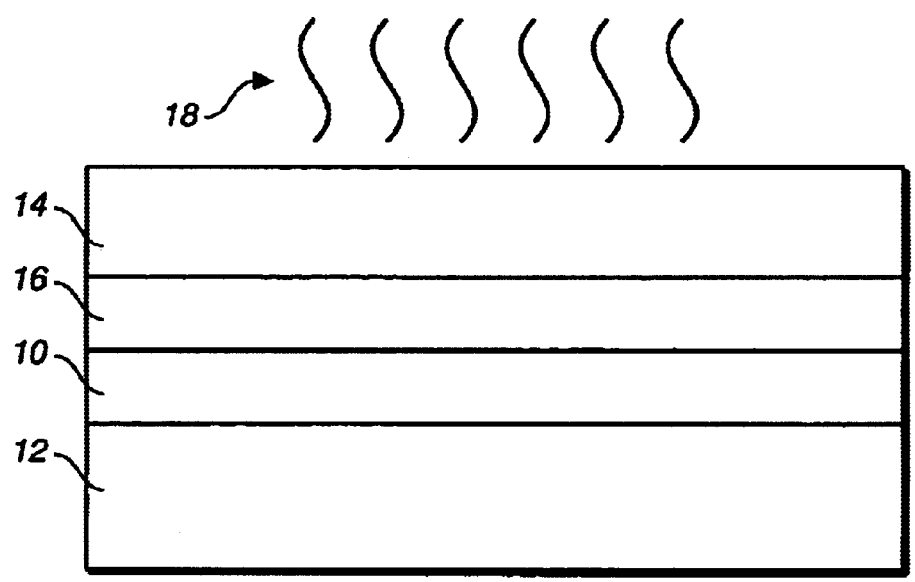
FIG._1
*(PRIOR ART)*
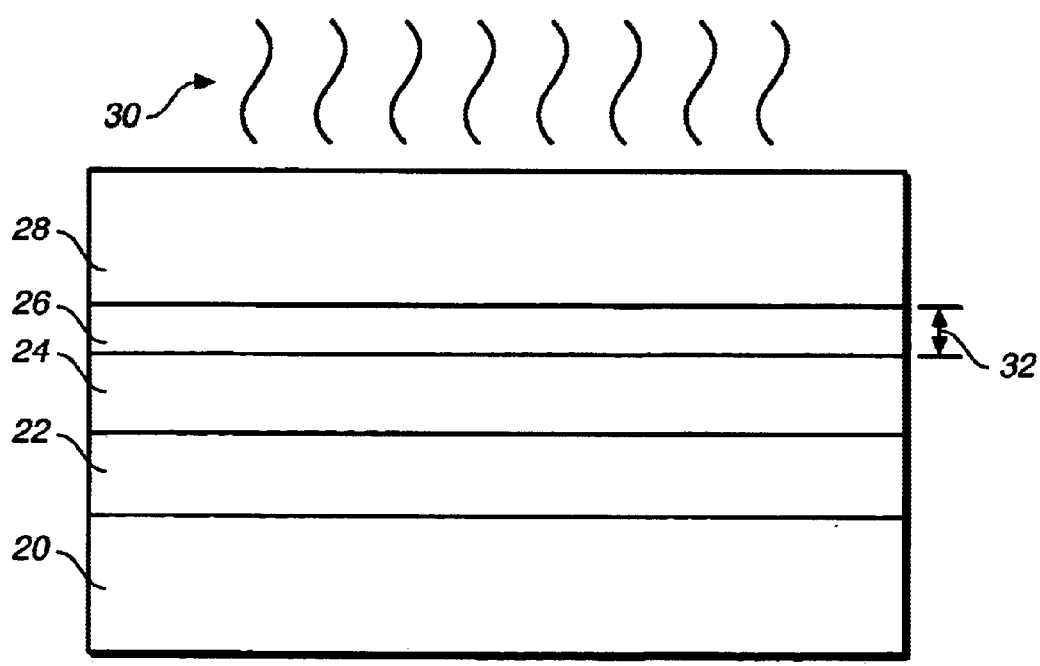
FIG._3

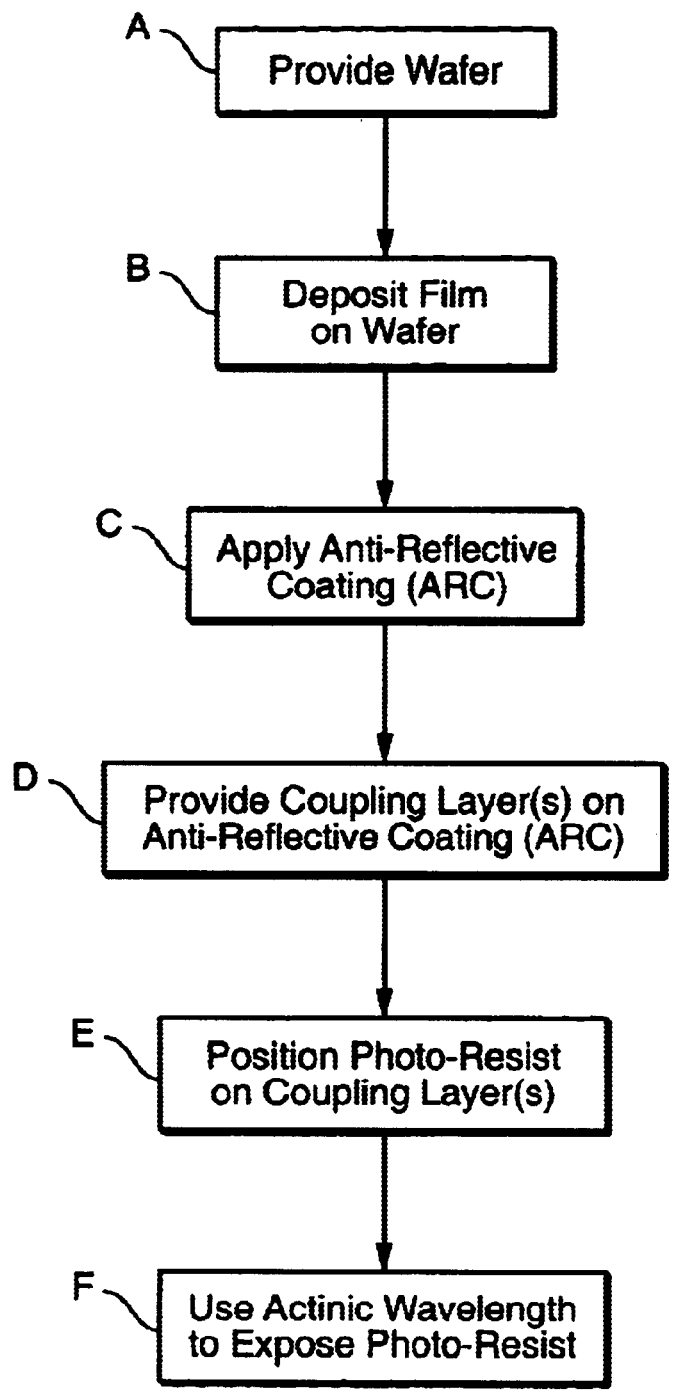
FIG._2

METHOD TO IMPROVE THE RESOLUTION OF A PHOTOLITHOGRAPHY SYSTEM BY USE OF A COUPLING LAYER BETWEEN THE PHOTO RESIST AND THE ARC

BACKGROUND

The present invention generally relates to photolithography processes used to make semiconductor devices, and more specifically relates to a method of photolithography where a coupling layer is employed between the photo resist and an anti-reflective coating or layer, thereby improving the resolution of the resulting resist image.

Presently, deep ultra violet (DUV) (i.e., 365 nanometers (nm), 248 nm, 193 nm and 157 nm) exposure systems are being used for the production of advanced semiconductor devices. Such a system typically provides as shown in FIG. 1, wherein a thin film 10 to be imaged is deposited on a wafer 12, and a photo resist 14 is laid down above the substrate 10. As shown in FIG. 1, due to the high reflectivity of semiconductor substrates at these wavelengths, typically an anti-reflective coating (ARC) 16 must be provided between the substrate 10 and the photo resist 14. The anti-reflective coating 16 works to keep the deep ultra violet energy 18 from reflecting back into the photo resist 14, thereby improving photo resist process performance and maintain critical dimensions control at, for example, sub-0.250 micron features sizes and smaller.

Typically, the attenuation ability of an anti-reflective coating is changed by adjusting the chemicals which are used to generate the anti-reflective coating 10 and/or the processing of the films. Further optimization of the attenuation is typically effected by manipulating the thickness of the anti-reflective coating 10 and the bake process (i.e., time, temperature) to minimize the reflectivity of the anti-reflective coating 10.

Regardless, typically at least some deep ultra violet energy reflects back into the photo resist 14. One of the problems with any type of anti-reflective coating is that the light (i.e., the deep ultra violet energy) must travel through the interface between the photo resist 14 and the anti-reflective coating 10, and the interface itself is a source of reflection back into the photo resist 14. The reflected energy may be, for example, 3% or greater with some of the new SiON films which are presently being used as anti-reflective coatings. This reflected energy degrades the resist image by creating constructive and destructive properties as the reflected energy passes back through the resist film stack in an unpredictable manner.

OBJECTS AND SUMMARY

A general object of an embodiment of the present invention is to provide a method to improve the resolution of a photolithography system by using one or more coupling layers between a photo resist and an anti-reflective coating.

Another object of an embodiment of the present invention is to provide a method of photolithography wherein the energy which is reflected back into the photo resist is minimized.

Still another object of an embodiment of the present invention is to provide a method of photolithography which uses one or more coupling layers between a photo resist and an anti-reflective coating in order to compensate for a mis-match in indexes of reflection between the photo resist and anti-reflective coating.

Briefly, and in accordance with at least one of the foregoing objects, an embodiment of the present invention provides a method of photolithography which includes steps of providing a wafer, depositing a film on the wafer, applying an anti-reflective coating to the substrate, providing a photo resist, and providing one or more coupling layers between the anti-reflective coating and the photo resist.

Another aspect of the present invention provides a device which is configured to be processed using photolithography. The device includes a wafer, a substrate, a photo resist, an anti-reflective coating between the photo resist and the substrate, and one or more coupling layers between the photo resist and the substrate.

BRIEF DESCRIPTION OF THE DRAWINGS

The organization and manner of the structure and operation of the invention, together with further objects and advantages thereof, may best be understood by reference to the following description, taken in connection with the accompanying drawings, wherein:

FIG. 1 shows typical layers of a prior art photolithography system, where the system is used to make semiconductor devices;

FIG. 2 is a block diagram of a method which is in accordance with an embodiment of the present invention; and FIG. 3 shows the layers of a photolithography system wherein the method shown in FIG. 2 is being used in order to improve the resolution of the resulting resist image.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

The present invention provides that one or more coupling layers are used between a photo resist and an anti-reflective coating in a photolithography system. The coupling layer(s) compensate for a mis-match in indexes of reflection between the photo resist and anti-reflective coating and minimize the amount of energy which is reflected back into the photo resist, thereby improving the quality of the resulting image which is formed on the photo resist during the process.

FIG. 2 illustrates the method while FIG. 3 illustrates the layers of a photolithography system wherein the method shown in FIG. 2 is used. As shown, the method provides that a wafer 20 is provided (block A in FIG. 2) and a film 22 to be imaged is deposited on the wafer 20 (block B in FIG. 2). Then, an anti-reflective coating 24 is applied to the substrate 22 (block C in FIG. 2), one or more coupling layers 26 are provided on the anti-reflective coating 24 (block D in FIG. 2), and a photo resist 28 is positioned above the one or more coupling layers 26 (block E in FIG. 2). Then, actinic wavelength 30 is used to expose the photo resist 28 (block F in FIG. 2), such as deep ultra violet (DUV) energy in the form of an aerial image from an appropriate illumination source. The thickness (dimension 32 in FIG. 3) of the coupling layer (or collective thickness of the coupling layers, if more than one coupling layer is provided) 26 may be one quarter the wavelength of the light 30 which is aimed at the photo resist 28.

Both the anti-reflective coating (ARC) 24 and coupling layer(s) 26 could be deposited CVD/PVD or spin on films.

Preferably, the index of reflection (IR) of the coupling layer (or collective index of reflection (IR) of the coupling layers, if more than one coupling layer is provided) 26 is between the indexes of reflection (IR's) of the anti-reflective coating 24 and the photo resist 28. Specifically, preferably the index of reflection (IR) of the coupling layer 26 is equal to the geometric mean of the indexes of reflection (IR's) of the anti-reflective coating 24 and the photo resist 28. This provides for reduced reflectivity of the energy. This is because energy transfer from first film to a second film depends on how closely their optical impedances match. If there is more than one coupling layer 26, preferably, the index of reflection (IR) of each layer is equal to the geometric mean of the indexes or reflection (IR's) of the layer on either side of the film. By having one or more coupling layers 26 between the photo resist 28 and the anti-reflective coating 24, with the index of reflection (IR) of the coupling layer(s) 26 being between the indexes of reflection (IR's) of the anti-reflective coating 24 and the photo resist 28, the "coupling" of the light from one film to the other will be greatly improved. In other words, there will be less energy reflected back toward the photo resist. As a result, the resolution of the resulting image is improved.

The coupling layer(s) 26 may be based on a spin on film, i.e., the coupling layer(s) 26 could be a variant of the photo resist 28, which is spun on before the normal resist 28. Alternatively, the coupling layer(s) 26 may be a variant of the anti-reflective coating layer 24, be it a spin on or CVD/PVD film. By using films that are based on the photo resist chemistry or the chemistry used in the anti-reflective coating layer, there is reduced mis-match with regard to processing.

The method in accordance with an embodiment of the present invention could be used with a topside anti-reflective coating film. If there is a large difference in the index of reflection (IR) of the anti-reflective coating 24 and the photo resist 28, then more than one coupling layer may need to be used.

While an embodiment of the present invention is shown and described, it is envisioned that those skilled in the art may devise various modifications of the present invention without departing from the spirit and scope of the appended claims. For example, while use of the method in association with deep ultra violet (DUV) energy has been described, the method can also be applied effectively to any electromagnetic wavelength printing technology.

What is claimed is:

1. A method of photolithography comprising:
   providing a wafer;
   depositing a film to be imaged on the wafer;
   applying an anti-reflective coating to the film;
   providing a photo resist; and
   providing one or more coupling layers between the anti-reflective coating and the photo resist, wherein the index of reflection of the coupling layer is equal to the geometric mean of the indexes of reflection of the anti-reflective coating and the photo resist.

2. A method as recited in claim 1, wherein the step of providing one or more coupling layers between the anti-reflective coating and the photo resist comprises applying one coupling layer to the anti-reflective coating and the method further comprises placing the photo resist on the coupling layer.

3. A method as recited in claim 1, further comprising using actinic wavelength to expose the photo resist.

4. A method as recited in claim 3, wherein the said coupling layer has a thickness which is one quarter the actinic wavelength.

5. A method as recited in claim 1, wherein the step of providing one or more coupling layers between the anti-reflective coating and the photo resist comprises providing a plurality of coupling layers between the anti-reflective coating.

6. A device configured to be processed using photolithography, said device comprising:
   a wafer;
   a film;
   a photo resist;
   an anti-reflective coating between the photo resist and the film; and
   one or more coupling layers between the photo resist and the film, wherein the index of reflection of the coupling layer is equal to the geometric mean of the indexes of reflection of the anti-reflective coating and the photo resist.

7. A device as recited in claim 6, wherein the one or more coupling layers is between the photo resist and the anti-reflective coating.

8. A device as recited in claim 6, wherein there is one coupling layer between the photo resist and the anti-reflective coating.

9. A device as recited in claim 6, wherein there are a plurality of coupling layers between the anti-reflective coating and the photo resist.

10. A method of photolithography comprising:
    providing a wafer;
    depositing a film to be imaged on the wafer;
    applying an anti-reflective coating to the film;
    providing a photo resist; and
    providing a plurality of coupling layers between the anti-reflective coating and the photo resist, wherein the anti-reflective coating has an index of reflection, each of said coupling layer has an index of reflection, and the photo resist has an index of reflection, wherein the index of reflection of each of the coupling layers is a value which is between the indexes of reflection of the anti-reflective coating and the photo resist.

11. A device configured to be processed using photolithography, said device comprising:
    a wafer;
    a film on the wafer;
    an anti-reflective coating on the film;
    a photo resist; and
    a plurality of coupling layers between the anti-reflective coating and the photo resist, wherein the anti-reflective coating has an index of reflection, each of said coupling layer has an index of reflection, and the photo resist has an index of reflection, wherein the index of reflection of each of the coupling layers is a value which is between the indexes of reflection of the anti-reflective coating and the photo resist.

12. A method of photolithography comprising:
    providing a wafer;
    depositing a film to be imaged on the wafer;
    applying an anti-reflective coating to the film;
    providing a photo resist; and
    providing a single coupling layer between the anti-reflective coating and the photo resist, wherein the anti-reflective coating has an index of reflection, said coupling layer has an index of reflection, and the photo resist has an index of reflection, wherein the index of reflection of the coupling layer is a value which is between the indexes of reflection of the anti-reflective coating and the photo resist.

13. A method as recited in claim 12, wherein the step of providing a single coupling layer between the anti-reflective coating and the photo resist comprises applying the coupling layer to the anti-reflective coating and the method further comprises placing the photo resist on the coupling layer.

14. A method as recited in claim 12, wherein the index of reflection of the coupling layer is equal the geometric mean of the indexes of reflection of the anti-reflective coating and the photo resist.

15. A device configured to be processed using photolithography, said device comprising:
   a wafer;
   a film on the wafer;
   an anti-reflective coating on the film;
   a photo resist; and
   a single coupling layer between the anti-reflective coating and the photo resist, wherein the anti-reflective coating has an index of reflection, said coupling layer has an index of reflection, and the photo resist has an index of reflection, wherein the index of reflection of the coupling layer is a value which is between the indexes of reflection of the anti-reflective coating and the photo resist.

16. A device as recited in claim 15, wherein the index of reflection of the coupling layer is equal the geometric mean of the indexes of reflection of the anti-reflective coating and the photo resist.

* * * * *